United States Patent [19]

Fong

[11] Patent Number: 5,061,895
[45] Date of Patent: Oct. 29, 1991

[54] SYSTEM FOR DETECTING AND CORRECTING MISALIGNMENT OF SEMICONDUCTOR PACKAGE LEADS

[75] Inventor: Carl H. Fong, San Jose, Calif.

[73] Assignee: VLSI Technology, Inc., San Jose, Calif.

[21] Appl. No.: 467,714

[22] Filed: Jan. 19, 1990

[51] Int. Cl.$^5$ .............................................. G01R 31/00
[52] U.S. Cl. ................................. 324/158 R; 324/537; 324/538
[58] Field of Search ............ 324/158 F, 158 P, 158 R, 324/537, 538, 513

[56] References Cited

U.S. PATENT DOCUMENTS 4,429,275  1/1984  Cedrone .......................... 324/158 F

FOREIGN PATENT DOCUMENTS

| 0093072 | 7/1980 | Japan | 324/537 |
| 0024160 | 2/1987 | Japan | 324/537 |
| 0169377 | 7/1989 | Japan | 324/538 |
| 0274075 | 11/1989 | Japan | 324/538 |
| 2208444 | 3/1989 | United Kingdom | 324/537 |

OTHER PUBLICATIONS

"Mass Verification Gauge", by Hoover, West. Elec. Tech. Dig., #57, 1/80, pp. 11–12.
"Compensating Chuck Assembly for Braze Pin Testing Apparatus", by Comulada et al, IBM Tech. Disc. Bull., vol. 24, #10, 3/82, pp. 5144–5145.

Primary Examiner—Kenneth Wieder
Assistant Examiner—William J. Burns
Attorney, Agent, or Firm—Majestic, Parsons, Siebert & Hsue

[57] ABSTRACT

A system for detecting whether the ends of leads of a semiconductor package are less than a small predetermined distance from a predetermined plane. The system uses a structure having a planar surface and an elevated portion on the surface where the portion is provided with a number of slots equal to or greater in number than the number of leads on one side of the package. The height of the slots above the surface is substantially equal to the predetermined distance. In order to test whether the end portions of the leads deviate from coplanarity by a distance greater than the predetermined distance, the package is placed with its leads in contact with the surface with the leads facing the slots. The package is then slid towards the slots to determine whether all of the leads will slide into the corresponding slots. The lateral distance between each pair of adjacent slots matches the distance between the corresponding pair of leads. Therefore, if any lead is bent laterally by a small amount, such bent lead may be corrected by first inserting the leads into the slots and then bending such bent lead against the sidewall of the slot corresponding to the lead.

10 Claims, 3 Drawing Sheets

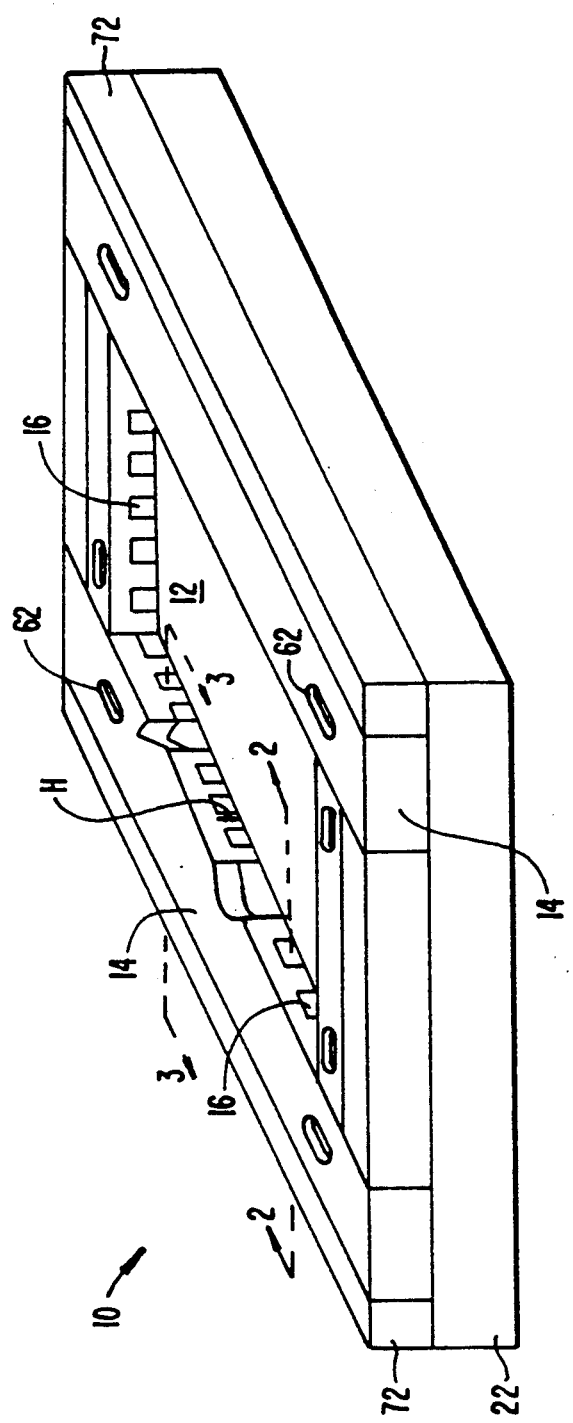
FIG._1.

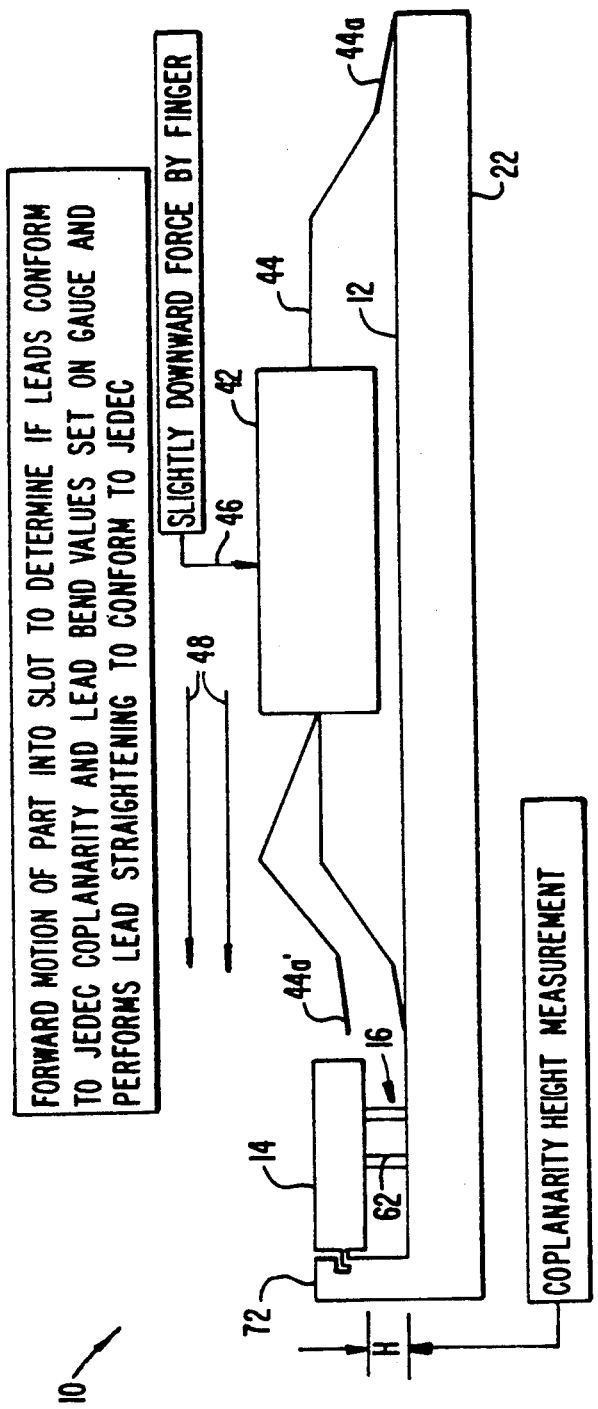

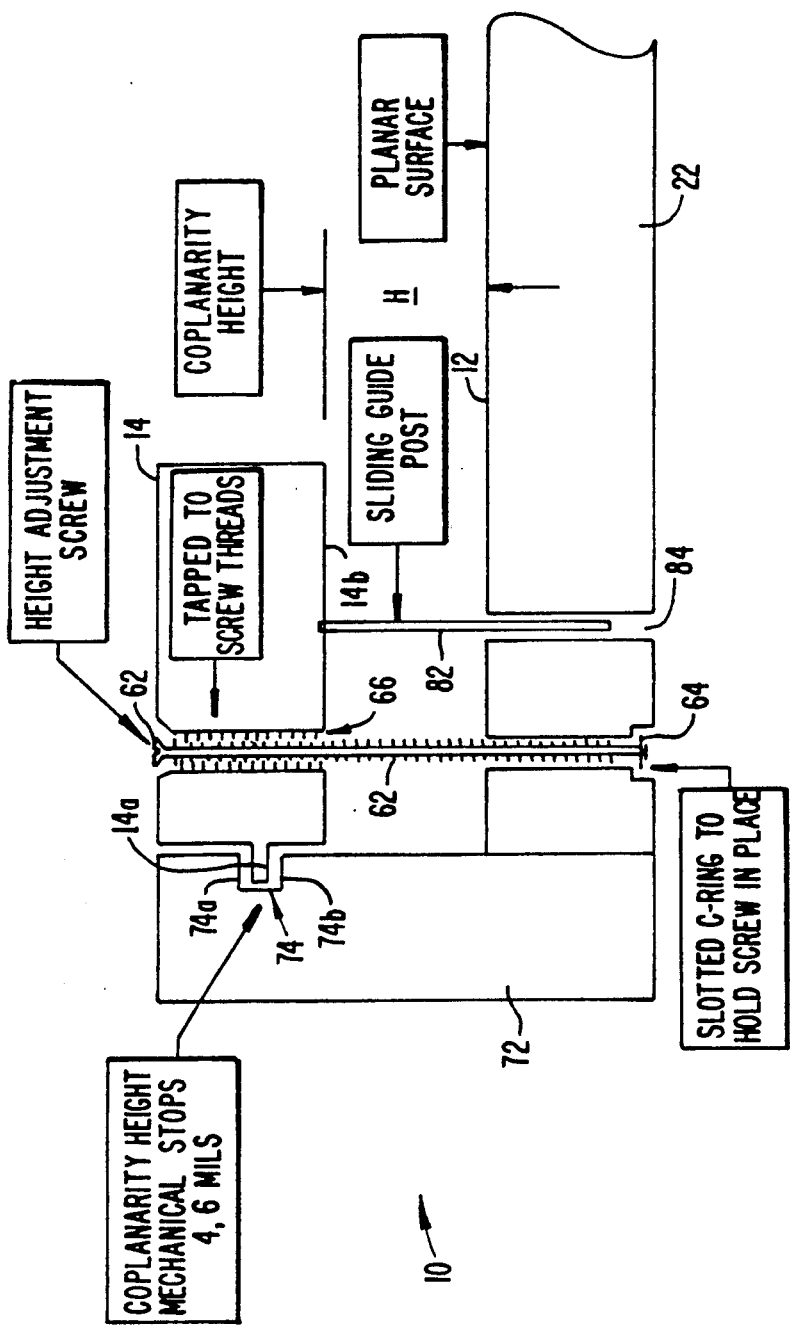
FIG._3.

SYSTEM FOR DETECTING AND CORRECTING MISALIGNMENT OF SEMICONDUCTOR PACKAGE LEADS

BACKGROUND OF THE INVENTION

This invention relates in general to systems for detecting the positions of leads of semiconductor packages and in particular to a system for detecting the coplanarity of such leads or the lack thereof. The system can also be used for correcting bent leads.

In traditional systems for connecting semiconductor chip packages to printed circuit boards, the printed circuit boards are provided with through holes. Leads of the packages are inserted into the through holes whereupon the leads are then soldered to the board. In standard through hole-type printed circuit boards, the through holes are spaced about 100 mils apart.

A new technique known as surface mount has been developed where the printed circuit boards do not contain through holes. Instead end portions of the leads are soldered directly to the board itself. The surface of the printed circuit board to which the leads are soldered is usually planar. In order for the leads to be properly soldered to the planar surface, the end portions of the leads should be coplanar or at distances from a predetermined plane that do not exceed a very short set distance. When such condition is met, and when the package is placed on top of the planar surface (such as the surface of a printed circuit board), the end portions of all the leads are in contact with or very close to the planar surface. The end portions of the leads may then be secured and electrically connected to the substrate by a conventional method, such as by soldering. Examples of this type of package include the gull-wing small outline integrated circuit (SOIC), and plastic quad flat pack packages (PQFP).

When a semiconductor package is mounted and connected to a surface of a substrate such as a printed circuit board, pads and/or connecting traces are usually provided on the surface of the substrate for connecting the semiconductor chip in the package to other devices. Therefore, in order to connect the proper lead to its corresponding pad or trace on the surface, the distance between adjacent leads should match the distance between the corresponding pads or traces on the surface. If the surface to which the leads are to be bonded is referred to as a horizontal plane, then not only must the vertical distance of the leads from the plane be smaller than a certain set small distance as explained above, but the distance (horizontal) between the end portions of adjacent leads must also match substantially the distance (horizontal) between adjacent pads or traces on the substrate. Otherwise, the end portions of the leads would not be in the proper locations to be soldered to the corresponding pads or traces on the substrate.

A number of conventional methods and devices have been used for testing the coplanarity of the leads. For example, feeler gauges have been used, where the leads are placed on top of a plane surface and the gauge is run under each lead to see if any specific lead or leads are at distances greater than a set standard distance from the plane surface; such lead or leads would fail to conform to the standard and would be unacceptable.

In another type of system for detecting coplanarity or the lack thereof using an optical comparator and a 45 degree mirrored gauge block, the leads are optically projected on a screen and the shadows of the leads are measured in comparison with a template to test the coplanarity of the leads. In the optical method, laterally (horizontally) bent leads can also be detected. After certain specific lead or leads have been discovered to be unacceptable, manual tools such as tweezers are used to repair the leads.

The above-described prior solutions have many disadvantages. The methods using the feeler gauge or optical comparator are very slow, since one lead is measured or detected at a time. The use of the feeler gauge and tweezers increases the chances of lead damage during testing and correction of bent leads. The optical method requires an optical comparator that is expensive. In all conventional methods described above, the lead straightening step or correcting step must be performed in a separate operation from that of testing coplanarity or lead bend so that the entire process of testing and subsequent correction is time consuming. It is therefore desirable to provide an improved system for testing lead coplanarity and for straightening the leads in which the above-described difficulties are alleviated.

SUMMARY OF THE INVENTION

This invention is directed mainly towards an apparatus for detecting the misalignment of the ends of flat style or gull-wing form type of leads of a semiconductor package where the ends of the leads should be coplanar or are less than a small set distance from a predetermined plane. As described above, certain semiconductor packages are designed using the surface mount technology where the ends of the leads are soldered directly to a planar surface of a substrate such as a printed circuit board. For such semiconductor packages, it is desirable for the end portions of the leads to be coplanar so that when the package sits on top of the planar surface of the substrate, the end portions of the leads come into contact with the planar surface for proper soldering or bonding. While the end portions of the leads can deviate from coplanarity to a small extent, the deviations cannot exceed a certain limit beyond which proper soldering becomes difficult or the quality of the soldered joint becomes questionable. Thus for the purpose of describing this invention, misalignment of the ends of the leads of the package is defined as the condition in which the end portion of at least one of the leads of the package is at a distance greater than a predetermined distance from a predetermined plane.

The apparatus of the invention is suitable for detecting the misalignment of the ends of the leads of a semiconductor package where the package is provided with a plurality of leads on at least one side of the package. The apparatus comprises a structure having a planar surface and an elevated portion on the surface. The elevated portion is provided with a plurality of slots therein. The number of slots is equal to or greater than the number of leads on said one side of the package. The height of the slots above the surface is substantially equal to the predetermined distance, so that when the package is placed with at least some of the end portions of the leads in contact with said surface with such leads facing the slots and when the package is slid towards the slots, the end portions of the leads will slide into the slots unless at least one of the end portions of the leads is misaligned.

BRIEF DESCRIPTION OF THE DRAWINGS

FIG. 1 is a perspective view of an apparatus for detecting the misalignment of package leads to illustrate the preferred embodiment of the invention.

FIG. 2 is a cross-sectional view of a portion of the apparatus of FIG. 1 along the line 2—2 in FIG. 1 and of a semiconductor package to illustrate the function of the apparatus of FIG. 1.

FIG. 3 is a cross-sectional view of a portion of the apparatus of FIG. 1 to illustrate the feature in which the heights of the vertical slots in the apparatus are adjustable, but where elevated portion 14 is raised from its position in contact with plate 22 in FIG. 1 to more clearly illustrate the invention.

DETAILED DESCRIPTION OF THE INVENTION

FIG. 1 is a perspective view of an apparatus for detecting misalignment of package leads to illustrate the preferred embodiment of the invention. Structure 10 has a planar surface 12 and an elevated portion 14 on surface 12. In the preferred embodiment, surface 12 is a surface of plate 22 and elevated portion 14 is a bar which is placed on top of surface 12, and is connected to plate 22 in a manner described below. Elevated portion 14 is provided with a plurality of slots 16. Structure 10 is suitable for detecting the misalignment of leads of a semiconductor package where the package is provided with a plurality of leads on at least one side of the package. The number of slots 16 is equal to or greater than the number of leads on the one side of the package with leads. The package to be tested by structure 10 is of the type where the ends of the leads should be coplanar or located less than a standard set small distance from a predetermined plane.

The slots 16 have substantially the same height H above surface 12 when the surface is placed in the horizontal orientation. The height H of the slots is equal to a predetermined set small distance (that is, the standard set distance) in order for structure 10 to test the misalignment of the leads of the package. The method for testing the misalignment of leads using structure 10 is illustrated in more detail in FIG. 2.

FIG. 2 is a cross-sectional view of a portion of structure 10 along the line 2—2 in FIG. 1, and of a semiconductor package to illustrate the function of structure 10. As shown in FIG. 2, a semiconductor package 42 with leads 44 sit on top of surface 12 of plate 22. Leads 44 have end portions 44a which ideally should be coplanar. If the end portions 44a are coplanar, when package 42 is placed on top of a planar surface (not shown in FIG. 2, but similar to surface 12 in its location relative to leads 44) to which it is to be connected so that the portions 44a are in contact with the surface, the end portions 44a are ready to be soldered or otherwise bonded to the surface. The planar surface to which the portions 44a are to be bonded defines a predetermined plane.

Where portions 44a are not exactly coplanar but are at distances less than a small set distance from the predetermined plane, the end portions may still be in proper positions for soldering or bonding to such planar surface. Such small distance has been set by the packaging industry. The JEDEC (Joint Electronics Defense Electronics Component) standard for the small set distance is 4 mils. Therefore, when chip 42 is placed on the surface to which leads 44 are to be bonded, and if portions 44a are at distances less than 4 mils to the surface, leads 44 meet the coplanarity requirement under JEDEC standards and are suitable for soldering or bonding to the surface.

This invention is based on the observation that the distances of the lead ends 44a from the surface to which they are to be soldered can be tested by using another planar surface such as surface 12. Therefore, by testing the distances of end portions 44a from surface 12 after chip package 42 is placed on surface 12 as shown in FIG. 2, it is possible to test whether package 42 meets a set standard, such as the JEDEC standard. The distances of the lead ends 44a from surface 12 are detected by means of slots 16 in portion 14 as described below.

As shown in FIGS. 1 and 2, elevated portion or bar 14 has slots 16 therein where the height H of slots 16 above surface 12 is equal to a predetermined set distance, such as the JEDEC standard of 4 mils. Package 42 has leads 44 on at least one side of the package. The number of slots 16 in bar 14 is equal to or exceeds the number of leads 44 on one or both sides of the package, so that slots 16 can be used for detecting the coplanarity of leads on both sides of the package.

In order to detect the coplanarity of leads on one side of the package, the package 42 is placed on surface 12 with the leads to be detected facing the slots 16 as shown in FIG. 2. The distance between the end portion 44a of each lead from surface 12 may be tested by sliding the package 42 towards slots 16. In the preferred embodiment, the sliding action may be accomplished simply by tilting surface 12 so that gravity will cause package 42 to slide towards the slots. Alternatively, a slight downward (along arrow 46) and forward (along arrows 48) force may be applied to the package, causing the package to move towards slots 16. If the distance between at least one of the leads to surface 12 is greater than H, such lead will miss the slot and will butt against bar 14, thereby preventing most of the leads from entering the slots 16.

As shown in FIG. 2, the distance between end portion 44a' to surface 12 is greater than H so that the portion will butt against bar 14 and not enter slots 16. Therefore, by placing package 42 on surface 12 and sliding the package with the leads on its one side facing slot 16, it is possible to determine in a very simple manner whether the end portions of the leads are at distances from surface 12 that are less than the set standard H. The above described system has the advantage that all the leads located on one side of the package can be tested at one time so that testing using this technique is much faster than that using conventional techniques described above. Since only the force of gravity or a slight force is applied to the package, the leads are unlikely to be damaged or bent by the testing process. The structure used is simple and no expensive equipment is required.

In many semiconductor packages, the lead width may be in the range of 8 to 16 mils and the distance between lead centers of adjacent leads may vary from 25 to 50 mils. Structure 10 is designed such that the distance between the centers of adjacent slots 16 is substantially equal to the distance (such as 50 mils) between the centers of adjacent leads. In this manner when the leads on one side of the package are substantially coplanar and are at proper spacing from one another, they will all be in position to fit into corresponding slots in portion 14. For some packages to be tested, even though the leads are coplanar, the lateral distance between the centers of a pair of adjacent leads may deviate from that desired, in a phenomenon called lead bend (in the horizontal or lateral direction). This can also be tested as well as corrected using structure 10.

In reference to FIG. 2, after package 42 is placed on surface 12 and the leads are slid towards slots 16, if it is observed that an end portion of a lead butts against a portion of bar 14 between slots 16 even though the remaining leads are in position to enter their corresponding slots, such problem lead exhibits lead bend and its position should be corrected. Where the bending or deviation of the problem lead from the desired position is within certain limits (that is, small), the leads will still enter the slots when the lead ends are at certain positions relative to the slots. The correction may be performed simply by moving package 42 in a direction parallel to elongated bar 14 (that is, in a direction normal to the plane of FIG. 2) until all the leads on one side of the package enters corresponding slots 16. The problem lead can then be straightened out by bending such lead against the appropriate side wall of the slot 16 corresponding to such lead.

The width of the slots 16 is designed to permit bent leads to enter, provided that the bent lead does not deviate too far from the desired position. Thus in the preferred embodiment, the slot width is about 24 mils. If the lead width is 14 mils, the slots 16 are therefore in position to receive leads which are bent to within 5 mils to each side of the desired position of the lead. The above stated dimensions are used only for illustrating the invention. It will be evident that the invention applies to slots of other dimensions as well. In the preferred embodiment, elevated portion or bar 14 has at least one notch therein to accommodate packages with bumper corners, such as JEDEC plastic quad flat type packages.

Portion or bar 14 is connected to plate 22 in such manner that the set standard H is adjustable to values between about 4 to 6 mils. The manner in which bar 14 is connected to plate 22 to permit such adjustment is described in more detail below. It is evident, however, that bar 14 may be connected to plate 22 in such manner that the set standard H is adjustable to values in other ranges of distances; all such variations are within the scope of the invention.

FIG. 3 is a cross-sectional view of a portion of the apparatus of FIG. 1 along the lines 3—3 to illustrate the feature in which the heights of the vertical slots in the apparatus are adjustable. However, FIG. 3 differs from an exact cross-sectional view of FIG. 1 in that portion or bar 14 is raised from its lowest position in contact with surface 12 (as shown in FIG. 1) to more clearly illustrate the mechanical stop function of bar 14 and stop 72. As shown in FIGS. 1 and 3, each elevated portion or bar 14 is connected to plate 22 by means of two screws 62. Screw 62 fits within a bore in plate 22 and is held at a constant height relative to plate 22 by means of a slotted C-ring 64. Screw 62 also fits within a bore 66 in bar 14 where bore 66 is provided with threads complementary to those on screw 62 so that when screw 62 is turned, it is possible to raise or lower bar 14 relative to plate 22. A mechanical stop member 72 attached to plate 22 is used to set the minimum and maximum distances by which the ends of the leads may deviate from coplanarity before the package tested is deemed rejectable. Mechanical stop 72 is provided with a notch 74 therein into which a protruding ridge 14a of bar 14 protrudes as shown in FIG. 3. Thus when screw 62 is turned to increase the separation H between surface 14b of bar 14 and surface 11a of plate 22, ridge 14a will move closer towards surface 74a of notch 74 until ridge 14a contacts surface 74a. The distance H between surface 14b at such position and plate 22 is then the maximum set distance by which the end portions of the leads may deviate from coplanarity without being rejectable under the set standard. If screw 62 is turned to reduce the separation H, ridge 14a will come into contact with surface 74b of the notch, where the separation H at such point is the minimum separation or coplanarity height setting the limit of deviation of the end portions of leads from coplanarity without being rejectable. In the preferred embodiment, surfaces 74a, 74b are located relative to plate 22 such that the maximum and minimum of the coplanarity height or separation H are 6 and 4 mils respectively. Obviously, other set standards may be chosen using the same arrangement as shown in FIG. 3; all such arrangements are within the scope of the invention. To assure that surface 14b remains essentially parallel to the upper surface 12 of plate 22 while screw 62 is being turned, a sliding guide post 82 attached to bar 14 is provided. The guide post 82 is designed to slide into a bore 84 in plate 22. Guide post 82 and bore 84 have such relative dimensions that once the post is inserted into the bore, surface 14b will remain substantially parallel to surface 12. Obviously, post 82 may be attached to plate 22 and bore 84 may be provided in bar 14 instead.

While the invention has been described above in reference to the preferred embodiment, it will be understood that various modifications may be made without departing from the invention, the scope of which is to be limited only by the appended claims.

What is claimed is:

1. An apparatus for detecting the misalignment of the ends of leads of a semiconductor package, said package provided with a plurality of leads on at least one side of the package, each lead having an elongated end portion having a side along its length, wherein misalignment is defined as the condition in which the side of the end portion of at least one of the leads of the package is at a distance greater than a predetermined value from a predetermined plane, said apparatus comprising a structure having a planar surface and an elevated portion on said surface, said elevated portion provided with a plurality of slots therein, each of said slots having a slot surface in said portion, wherein the maximum distance from said slot surface to said planar surface is the height of said slot, a portion of said slot surface forming a part of said planar surface, the number of slots being equal to or greater than the number of leads on said one side of the package, wherein the heights of said slots above the surface are substantially equal to the predetermined value, so that when the package is placed with at least some of the sides of the end portions of the leads in contact with said surface with the leads facing the slots and when the package is slid along said surface towards the slots with the sides of the end portions maintaining contact with said surface, the end portions of the leads will slide into the slots unless the end portion of at least one of the leads is misaligned.

2. The apparatus of claim 1, wherein the heights of the slots are adjustable to be between about 4 and 6 mils.

3. The apparatus of claim 1, said structure comprising a plate and a bar forming the elevated portion, said apparatus further comprising means for connecting the bar to the plate in such manner that the heights of the slots are adjustable.

4. The apparatus of claim 3, wherein the distance between the bar and the plate is adjustable so that the heights of the slots are adjustable to be between about 4 and 6 mils.

5. The apparatus of claim 3, wherein said connecting means includes a height adjustment screw and a height stop, wherein said stop is in position to stop the bar when the bar is at 4 and 6 mils from the plate.

6. The apparatus of claim 1, said slots having sidewalls, wherein in order for the leads of the package to be in desired positions for proper bonding to substrates, the distance between the centers of end portions of a pair of adjacent leads of a package is preferably equal to a predetermined distance, wherein each slot corresponds to one lead of the package, and wherein the distance between the centers of a pair of slots is substantially the same as the predetermined distance between the centers of corresponding pair of leads, so that when the distance between the centers of end portions of any two adjacent leads deviates from the predetermined distance for such pair of leads, the position of one of the two leads is correctable by bending such lead against the sidewall of the slot after the end portions of the leads are slided into the slots.

7. The apparatus of claim 1, wherein said elevated portion has at least one notch therein to accommodate packages with bumper corners.

8. A method for detecting the misalignment of the ends of leads of a semiconductor package, said package provided with a plurality of leads on at least one side of the package, each lead having an end portion, wherein misalignment is defined as the condition in which the end portion of at least one of the leads of the package is at a distance greater than a predetermined value from a predetermined plane, said method employing an apparatus comprising a structure having a planar surface and an elevated portion on said surface, said elevated portion provided with a plurality of slots therein, the number of slots being equal to or greater than the number of leads on said one side of the package, wherein the heights of said slots above the surface are substantially equal to the predetermined value from the surface, said method comprising:

placing the package with at least some of the end portions of the leads in contact with said surface with the leads facing the slots;

sliding the package towards the slots; and determining whether the end portions of the leads will slide into the slots.

9. The method of claim 8, said slots having sidewalls, wherein in order for the leads of the package to be in desired positions for proper bonding to substrates, the distance between the end portions of a pair of adjacent leads of a package is preferably equal to a predetermined distance, wherein each slot corresponds to one lead of the package, and wherein the distance between a pair of slots is substantially the same as the predetermined distance between the corresponding pair of leads, said method further comprising:

determining whether the distance between the end portions of any two adjacent leads deviates from the desired predetermined distance; and correcting the position of one of the two leads by bending such lead against a sidewall after the end portions of the leads are slided into the slots.

10. The method of claim 8, wherein the sliding step is performed by tilting the planar surface, so that gravity causes the package placed on the surface to slide towards the slots.

* * * * *